March 12, 1957 E. HEINECKE 2,785,235

HIGH-EFFICIENCY LINEAR AMPLIFIER

Filed Dec. 10, 1953

INVENTOR
ERICH HEINECKE

BY Philip M. Bolton
ATTORNEY 2,785,235

HIGH-EFFICIENCY LINEAR AMPLIFIER

Erich Heinecke, Berlin-Tempelhof, Germany, assignor to International Standard Electric Corporation, New York, N. Y., a corporation of Delaware Application December 10, 1953, Serial No. 397,367

Claims priority, application Germany December 12, 1952

5 Claims. (Cl. 179—171)

This invention relates to high-efficiency linear type amplifiers and particularly to Doherty-type amplifiers of the kind disclosed in U. S. Patent 2,210,028, issued August 6, 1940.

Such amplifiers were developed to increase the efficiency of the final stages of high frequency transmitters. The power amplifier is subdivided into two tube stages arranged to act on a load impedance common to them. Between this load impedance and one of the component stages, which is usually known as a carrier stage, a network is arranged to effect phase quadrature. Accordingly, it is required that the input or control voltage supplied to either component stage is in phase quadrature with that supplied to the other component stage. Up to a certain degree it is only the carrier stage that acts on the said impedance load, while operation of the other or additional stage is prevented by a sufficiently high negative bias on its tube. The additional stage does not begin to operate until this degree is exceeded. The carrier stage is so adjusted that when the exciting voltage is the unmodulated carrier, the tube is just beginning to saturate with a load impedance that is twice the impedance that would be used to develop the output. The object is to retain this voltage value of the input or carrier stage during the period that the control voltage is increasing to its maximum value. Normally this is done by the additional stage itself because the 90°-section between the two stages acts to decrease the load resistance effective at the anode of the carrier tube; this resistance finally is reduced to half its value. For many reasons, such as variation of the mains supply voltage, or variation of the direct anode voltage through the modulation process itself, or through variation of the internal resistance of the anode voltage sources, the desired limit-voltage state of the carrier tube may be exceeded. From this state forward in the positive direction the anode current of the carrier tube can no longer follow the control voltage thereof and the current flowing into the anode network will be non-linear in respect of modulation. The anode network being in the nature of a non-dissipative quadripole with phase quadrature, will produce an output voltage precisely proportional to the input current. The voltage the the load resistance will hence be distorted correspondingly with consequential increase of the distortion factor inherent in the modulation.

Figure 1:
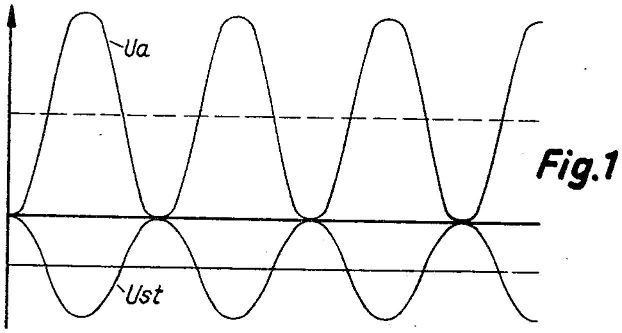
Figure 2:
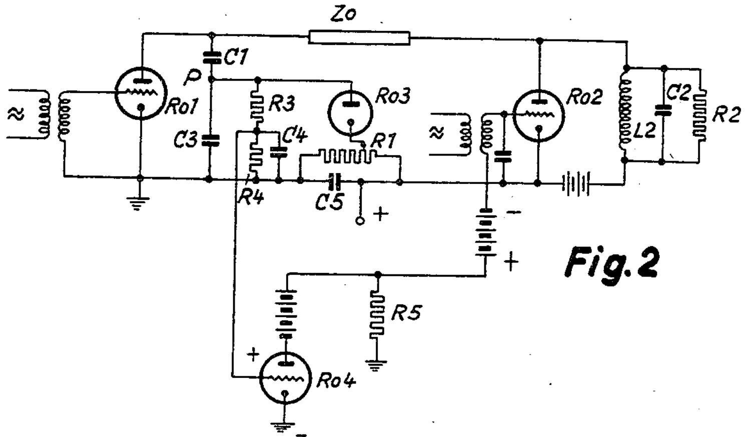
Figure 3:
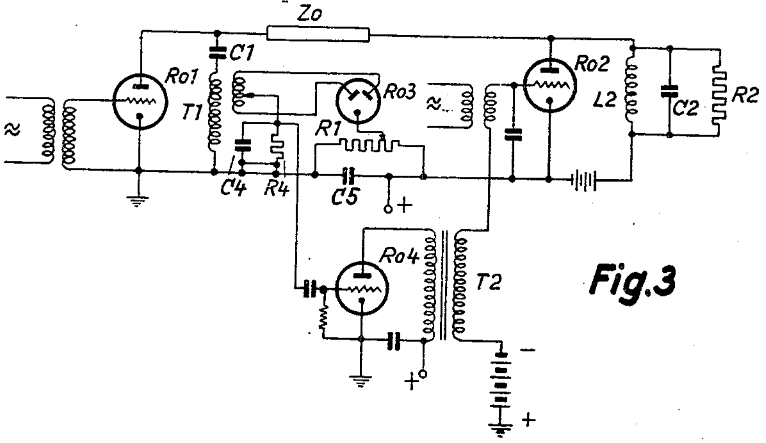

These considerations and the invention will be fully understood from the following description, reference being had to the accompanying drawing, wherein: Fig. 1 is a diagram showing the control and output voltages; Fig. 2 is a schematic diagram of one embodiment of the invention; and Fig. 3 is an alternative embodiment of the invention.

In Fig. 1 the fundamental limit-voltage state of an amplifier is illustrated. U*a* represents the alternating anode voltage, U*st* the control voltage. The two are in phase opposition to each other. The characteristic feature of the limit-voltage state is that the maximum value of U*st* is approximately equal to the minimum value of U*a*. If with U*st* constant U*a* still increase then the so-called overtensioned state will arise, and the voltage at the anode will decrease to a minimum value below the control voltage.

The limit-voltage state, in respect of its high-frequency alternating anode voltage may also be given by the magnitude of the direct anode voltage, that is to say, it can also be ascertained by comparing the direct anode voltage with the H. F. alternating anode voltage.

According to the present invention the limit-voltage state is continually supervised, as, for instance, by way of such a comparison, and this state, when exceeded, is automatically corrected by the additional stage becoming correspondingly controlled either directly or indirectly.

In Fig. 2, R*o*1 denotes the carrier tube and, R*o*2 the additional tube of a Doherty amplifier circuit that comprises also the oscillatory anode circuit L2, C2 and the load resistance R2. The tubes R*o*1, R*o*2 have the 90°-section Z*o* interposed between them. Their grids are controlled in high-frequency fashion with the appropriate phase. For simplicity the modulation circuit is not shown. Connected in parallel with the high anode-voltage of the two tubes R*o*1, R*o*2 is a potentiometer R1 from which the voltage for the cathode of a diode R*o*3 is taken. The anode of R*o*3 is connected to a capacitive voltage divider comprising the capacities C1, C3. Two resistances R3, R4 connected in series, are joined in parallel with C3. Resistance R4 is bridged by a capacity C4. Connected to R4 is the grid of a tube R*o*4 whose anode circuit has a resistance R5 included in it. R5 is connected to the grid of the additional tube R*o*2 over a source of biasing potential.

This arrangement operates as follows.

At the anode of the carrier tube R*o*1, the limit voltage should always be effective from the carrier value onward. For this purpose the diode R*o*3 has its anode joined to the voltage divider C1, C3. The tap on potentiometer R1 is so positioned that with tube R*o*1 in its limit-voltage state, current shall still be prevented from flowing through diode R*o*3, that is to say, R1 is so adjusted that the positive direct potential on the cathode of R*o*3 shall equal the peak value of the high-frequency voltage at point P and hence at the anode of tube R*o*3. If for any reason the alternating voltage at P increases, the limit voltage thus becoming exceeded, R*o*3 will carry current. Thus a negative direct voltage arises at R3, R4 whose H. F. ripple at R4 is suppressed by the filter effect of the resistance-capacity combination R4, C4 so that at R4 and hence on the grid of R*o*4 a negative direct voltage free from considerable ripple will appear. Therefore the reversing effect of the amplifying circuit of R*o*4 gives rise to an increase of positive voltage at R5 whereby the additional tube R*o*2 is controlled more intensely by the high-frequency energy and thus the alternating anode current of R*o*2 is increased. In this way and due to the reversing property of the 90°-section Z*o* between the tubes R*o*1, R*o*2 there results at the anode of carrier tube R*o*1 the desired decrease of the alternating anode voltage and consequential reduction to the original limit-voltage state.

Another embodiment of the invention is shown in Fig. 3, wherein instead of the capacitive voltage divider a H. F. transformer T1 having a center tap on its secondary is represented while the diode R*o*3 is shown as a full-wave rectifier.

The general advantages of the arrangements herebefore described lie in the fact that with sufficient steepness of the control operation any overtension condition of the carrier tube and thus trouble through such condition can be obviated.

The condition of the energized carrier tube from the carrier value onward is easily adjusted without complicated manipulation of tuning elements; such adjustment being here accomplished by means of a potentiometer such as R1. The adjustment of the additional stage as to its working point will not be critical if the inventive control operation is of sufficient steepness.

In order that the invention may be readily understood the described embodiments thereof are restricted to controlling the final tubes only. The invention is, however, also applicable to arrangements in which both the carrier and additional stages comprise separate amplifying cascades which may be modulated separately by a low frequency. It is only important that the additional stage is controlled in dependence on the working condition of the carrier stage.

Where the carrier and additional stages are modulated separately it is also possible for the additional stage to be controlled exclusively as a function of the working condition of the carrier stage. In many cases, however, it will be convenient to provide, through the modulation, for a certain preliminary control of the additional stage and in this way add to the ease of correcting the arrangement.

What is claimed is:

1. A linear amplifying system of the Doherty type comprising a pair of amplifying devices, a source of input waves, means for applying said waves to input circuits of said amplifying devices respectively in phase-quadrature, a load circuit, means coupling the output of one of said amplifying devices to the output of said other amplifying device and to said load circuit via an impedance inversion network, means coupling the output of the other of said amplifying devices to said load circuit directly, whereby the outputs are cophasal in said load circuit; and a control circuit coupled between the output of one of said devices and the input of the other of said devices for compensating non-linear variations in the output of said one device, comprising a source of reference potential, the reference potential being equal to the peak amplitude of linear variations but less than the amplitude of non-linear variations, means for comparing the output of said one amplifying device with said reference potential and for producing a voltage when said output exceeds said reference potential, and means responsive to said voltage for increasing the output from said other amplifying device and correspondingly reducing the output from said one device, until a linear output from said one device is restored.

2. The system according to claim 1, wherein said control circuit comprises a two electrode electron device, means connecting one electrode to said reference source, means coupling the other electrode to the output of said one device, the electron device being polarized to conduct when the voltage at the output of said one device exceeds said reference potential, means applying the output from said electron device to an amplifying circuit, and means applying the output from said amplifying circuit to said other device, the output from said other device corresponding in magnitude and sense to the output from said electron device, and causing the output from said one device to decrease as a result of the impedance inversion network interconnecting the outputs of said devices.

3. The system according to claim 2, wherein said two electrode electron device comprises a diode, and said one and other amplifying devices and said amplifying circuit comprise first, second and third electron vacuum tubes respectively, each having cathode, grid and anode electrodes.

4. The system according to claim 3, wherein said comparing means comprises a voltage divider network coupled across said first electron tube, and means connecting the anode of said diode to the electrical midpoint of said voltage divider network, the value of the reference potential applied to the cathode of said diode being equal to the voltage at said electrical midpoint during linear operation of said first electron tube.

5. The system according to claim 4, wherein said reference potential source comprises a potentiometer circuit.

References Cited in the file of this patent

UNITED STATES PATENTS

| | | |
|---|---|---|
| 2,210,028 | Doherty | Aug. 6, 1940 |
| 2,255,476 | Thomas et al. | Sept. 9, 1941 |
| 2,269,518 | Chireix et al. | Jan. 13, 1942 |